United States Patent
Nagahama et al.

(10) Patent No.: US 7,220,498 B2
(45) Date of Patent: May 22, 2007

(54) TUNNEL MAGNETORESISTANCE ELEMENT

(75) Inventors: Taro Nagahama, Tsukuba (JP); Shinji Yuasa, Tsukuba (JP); Yoshishige Suzuki, Tsukuba (JP)

(73) Assignees: National Institute of Advanced Industrial Science and Technology, Tokyo (JP); Japan Science and Technology Agency, Kawaguchi-shi (JP)

( * ) Notice: Subject to any disclaimer, the term of this patent is extended or adjusted under 35 U.S.C. 154(b) by 139 days.

(21) Appl. No.: 10/478,203

(22) PCT Filed: May 24, 2002

(86) PCT No.: PCT/JP02/05049

§ 371 (c)(1),
(2), (4) Date: Nov. 26, 2003

(87) PCT Pub. No.: WO02/099905

PCT Pub. Date: Dec. 12, 2002

(65) Prior Publication Data

US 2004/0144995 A1   Jul. 29, 2004

(30) Foreign Application Priority Data

May 31, 2001 (JP) ............................. 2001-163757
Sep. 14, 2001 (JP) ............................. 2001-279289
Apr. 23, 2002 (JP) ............................. 2002-121121

(51) Int. Cl.
    G11B 5/39      (2006.01)
(52) U.S. Cl. .................. 428/811.1; 428/813; 360/324.2
(58) Field of Classification Search .................... None
    See application file for complete search history.

(56) References Cited

U.S. PATENT DOCUMENTS

| | | | | |
|---|---|---|---|---|
| 6,368,706 | B1* | 4/2002 | Iwasaki et al. | 428/332 |
| 6,535,365 | B1* | 3/2003 | Lukaszew et al. | 360/324.2 |
| 6,611,405 | B1* | 8/2003 | Inomata et al. | 360/324.2 |
| 6,710,986 | B1* | 3/2004 | Sato et al. | 428/811.1 |
| 2002/0191355 | A1* | 12/2002 | Hiramoto et al. | 360/324.2 |

(Continued)

FOREIGN PATENT DOCUMENTS

EP   936 622   8/1999

(Continued)

OTHER PUBLICATIONS

Moodera, J., Nowak, J., Kinder, L., Tedrow, P., van de Veerdonk, R., Smits, B., van Kampen, M., Swagten, H., and de Jonge, W., Phys. Rev. Let., 83(15), Oct. 1999, 3029-3032.*

(Continued)

*Primary Examiner*—Kevin M. Bernatz
(74) *Attorney, Agent, or Firm*—Oblon, Spivak, McClelland, Maier & Neustadt, P.C.

(57) ABSTRACT

By varying only the thickness of a known material having superior magnetic characteristics to increase spin polarization without changing the chemical composition, a tunnel magnetoresistive element capable of producing a larger magnetoresistive effect is provided. The tunnel magnetoresistive element includes an underlayer (nonmagnetic or antiferromagnetic metal film); an ultrathin ferromagnetic layer disposed on the underlayer; an insulating layer disposed on the ultrathin ferromagnetic layer; and a ferromagnetic electrode disposed on the insulating layer.

6 Claims, 9 Drawing Sheets

U.S. PATENT DOCUMENTS

2005/0024791 A1* 2/2005 Kokado .................. 360/324.2

FOREIGN PATENT DOCUMENTS

| | | |
|---|---|---|
| JP | 9-181374 | 7/1997 |
| JP | 11-354859 | 12/1999 |
| JP | 2000-150985 | 5/2000 |
| JP | 2000-322714 | 11/2000 |
| JP | 2001-093119 | 4/2001 |
| JP | 2001-093119 A * | 4/2001 |
| JP | 2001-102656 | 4/2001 |
| WO | 99/041792 | 8/1999 |

OTHER PUBLICATIONS

JPO Abstract Translation of JP 2001-093119 A (Document ID: JP 2001093119 A)..*

Shinji Yuasa, et al., "Kohinshitsu Kyojisei Tunnel Setsugo Soshi no Sakusei", ETL NEWS, vol. 597, pp. 4-7 1990.

* cited by examiner

IN Fe CRYSTAL GRAINS

FIG. 17

TUNNEL MAGNETORESISTANCE ELEMENT

TECHNICAL FIELD

The present invention relates to tunnel magnetoresistive elements, and particularly to a ferromagnetic tunnel magnetoresistive element outputting a large signal, a tunnel magnetoresistive element in which the dependence of the magnetoresistive effect on bias voltage is controlled, and a tunnel magnetoresistive element whose crystal orientation is set to the (001) direction of a body-centered cubic lattice, a face-centered cubic lattice, or a tetragonal lattice.

BACKGROUND ART

The tunnel magnetoresistive effect is a phenomenon in which the electrical resistance of a ferromagnetic tunnel junction including an insulating material between two ferromagnetic metal electrodes is varied depending on the relative magnetization directions of the two ferromagnetic electrodes. The magnitude of magnetoresistance is expressed by the following equation:

$$\text{Magnetoresistive effect} = [(\text{Antiparallel } R - \text{Parallel } R)/\text{Parallel } R] \times 100 \ (\%) \quad (1)$$

Parallel R represents electrical resistance when the magnetization directions of the two ferromagnetic electrodes are parallel to each other; and Antiparallel R represents electrical resistance when the magnetization directions are antiparallel. This phenomenon was discovered in 1995 (T. Miyazaki and N. Tezuka, J. Magn. Mater., Vol. 139 (1995), L231), and applied researches to a magnetic sensor of a pickup head of a hard disk drive, a ferromagnetic random access memory, and so on have been advanced. In order to achieve a magnetic sensor or ferromagnetic random access memory using this effect, a large magnetoresistive effect is required, and it is desired that the magnitude of magnetoresistive effect at a limited bias voltage can be artificially controlled.

However, the tunnel magnetoresistive effect, first, has a problem in that it is limited by spin polarization ($P_1$ and $P_2$ in equation (2)) of the electrode material.

This relationship is expressed by Julliere's equation shown in below:

$$\text{Magnetoresistive effect} = [2P_1P_2/(1-P_1P_2)] \times 100 \ (\%) \quad (2)$$

Accordingly, in order to obtain a high magnetoresistive effect, a material with a high spin polarization has to be used. On this account, for example, an Fe—Co Alloy is prepared to increase the spin polarization. However, it is considered that even this technique provides a magnetoresistive effect of at most about 70% or less.

In order to solve this problem, use of a semimetal having a spin polarization of 100% in principle has been attempted. However, since such a semimetal is of a compound, its surfaces are unstable. No material suitable for practical use has been discovered.

Furthermore, for use as a magnetic sensor, the magnetic characteristics, as well as the spin polarization, of the material have to be optimized. Unfortunately, such a new material does not generally provide good magnetic characteristics.

Second, in general, the tunnel magnetoresistive effect is monotonously decreases as bias voltage increases. This decrease of magnetoresistive effect with increasing bias voltage is not easily controlled because it is an intrinsic problem resulting from increase of magnon scattering or phonon scattering. Accordingly, an attempt has been made to, for example, dualize a tunnel barrier wall layer so as to prevent the magnetoresistive effect from decreasing with increasing bias voltage.

On the other hand, Moodera et al. attempted to vary the dependence of magnetoresistance on bias voltage by disposing a polycrystalline nonmagnetic interlayer between a ferromagnetic electrode and a barrier layer (Moodera, Phys. Rev. Lett., vol. 83, 1999, pages 3029–3032).

Figure 1:
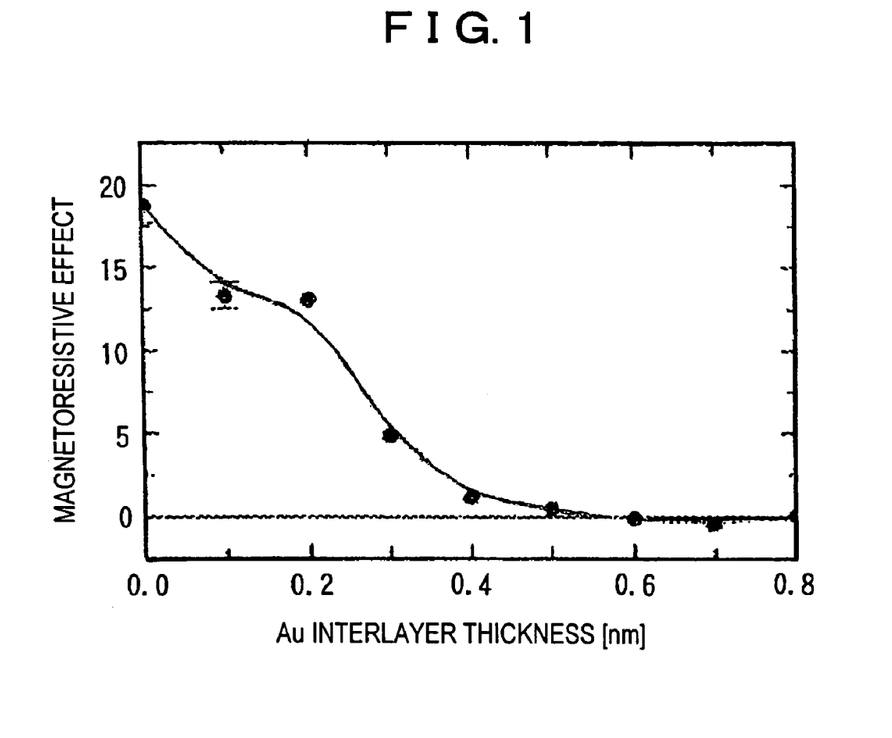
FIG. 1 is a plot showing the dependence of the junction magnetoresistive effect of a known magnetoresistive effect element on Au interlayer thickness at zero bias and 77 K.
Figure 2:
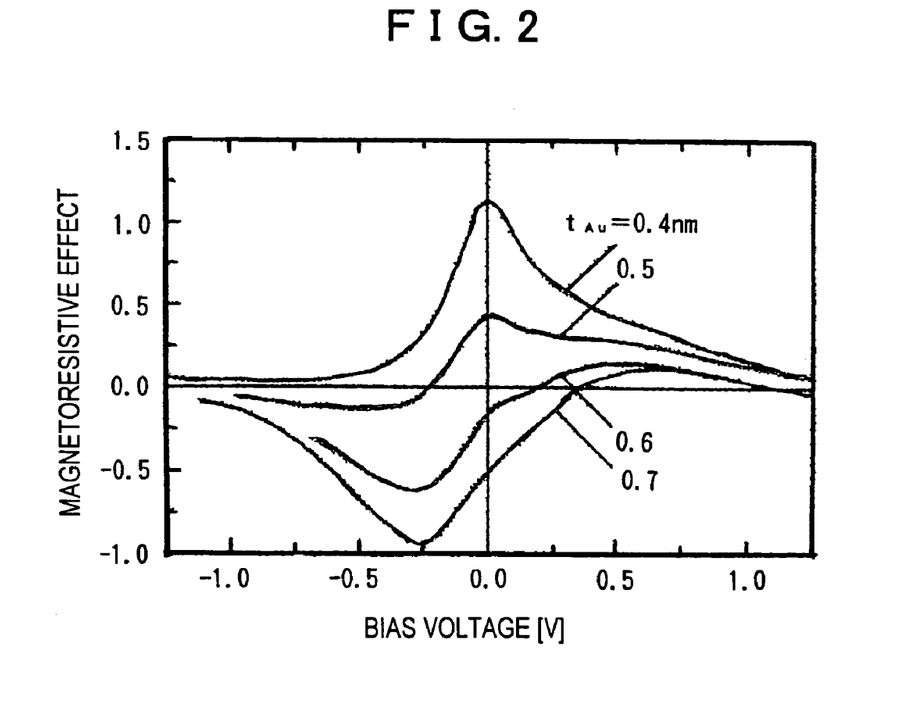
FIG. 2 is a plot showing the dependence of the magnetoresistive effect of a known magnetoresistive effect element on Au interlayer thickness at zero bias and 77 K.

FIG. 1 shows the dependence of junction magnetoresistive effect of a magnetoresistive effect element on the thickness of a Au interlayer at zero bias and 77 K, in which the horizontal axis represents the thickness (nm) of the Au interlayer and the vertical axis represents the magnetoresistive effect. FIG. 2 shows the dependence of magnetoresistive effect of the same element on bias voltage (V), in which the horizontal axis represents bias voltage (V) and the vertical axis represents the magnetoresistive effect.

However, in the foregoing magnetoresistive element in which the polycrystalline, nonmagnetic interlayer is disposed between the ferromagnetic electrode and the barrier layer, the scattering magnetoresistive effect of electrons is rapidly reduced as the thickness of the nonmagnetic interlayer increases, because the nonmagnetic interlayer is formed of a polycrystalline material. Although the bias voltage dependence of the magnetoresistive effect has been successfully controlled to some extent, characteristics sufficient for practical use have not been achieved.

Accordingly, it is desired to develop an element in which electron scattering of a nonmagnetic interlayer is reduced, the element whose magnetoresistive effect does not seriously reduced even if the thickness of the interlayer is large, and the element from which oscillation of spin polarization in a nonmagnetic layer can be drawn out as magnetoresistive effect.

Third, it has been pointed out that a barrier layer formed of MgO (001) single crystal produces a giant tunnel magnetoresistive effect (J. Mathon, et al., Physical Review B, volume 63 (2001), pages 220403(R)-1-4). Also, a giant tunnel magnetoresistive effect of more than 60% has been experimentally obtained (M. Bowen et al., Applied Physics Letters, volume 79, number 11 (2001), pages 1655–1657). In this instance, a single-crystal substrate is necessary to form an element. This however makes it difficult to form the element on a silicon LSI, and thus a challenge for realizing a magnetic random access memory has not yet overcome.

DISCLOSURE OF INVENTION

In view of the first problem, a first object of the present invention is to provide a tunnel magnetoresistive element capable of producing a larger magnetoresistive effect by varying only the thickness of a known material having superior magnetic characteristics to increase spin polarization without changing the chemical composition of the material.

In view of the second problem, a second object of the present invention is to develop an element structure in which electron scattering of a nonmagnetic interlayer is prevented and in which magnetoresistive effect is not reduced by the presence of the nonmagnetic interlayer, and to provide a tunnel magnetoresistive element in which the bias voltage dependence of the magnetoresistive effect can be artificially controlled by precisely controlling the thickness of the nonmagnetic interlayer.

In view of the third problem, a third object of the present invention is to provide a tunnel magnetoresistive element having a highly oriented, flat interface that is not affected by the structure and roughness of an amorphous or polycrystalline underlayer, by discovering a suitable material and developing a technique for allowing highly oriented crystals to grow evenly.

To these ends, there is provided:

[1] A tunnel magnetoresistive element including: an underlayer; an ultrathin ferromagnetic layer disposed on the underlayer; an insulating layer disposed on the ultrathin ferromagnetic layer; and a ferromagnetic electrode disposed on the insulating layer.

[2] A tunnel magnetoresistive element described in [1], wherein the thickness of the ultrathin ferromagnetic layer is on the order of atomic layers.

[3] A tunnel magnetoresistive element described in [2], wherein the thickness of the ultrathin ferromagnetic layer is in the range of 1 to 15 atomic layers.

[4] A tunnel magnetoresistive element described in [1], wherein the underlayer comprises a nonmagnetic or antiferromagnetic metal film.

[5] A tunnel magnetoresistive element described in [1], wherein the underlayer is a nonmagnetic or antiferromagnetic metal film formed on a ferromagnetic exchange coupling film.

[6] A tunnel magnetoresistive element described in [4], wherein the nonmagnetic or antiferromagnetic metal film comprises Au, Ag, Cu, Cr, V, Nb, Mo, Ta, W, Al, Pt, Ir, Rh, Ru, Pd, Os, or Mn.

[7] A tunnel magnetoresistive element described in [6], wherein the nonmagnetic metal film is formed from a single crystal, thereby enhancing thickness controllability.

[8] A tunnel magnetoresistive element described in [7], wherein the crystal orientation of the nonmagnetic metal film is set in the direction of (100)±10°, (111)±10°, (110)±10°, or (112)±10° of a cubic system, and thereby evenness is increased.

[9] A tunnel magnetoresistive element having a structure in which a nonmagnetic metal single crystal or nonmagnetic highly-oriented-polycrystalline interlayer lies between a barrier layer and a ferromagnetic electrode.

[10] A tunnel magnetoresistive element described in [9], wherein the interlayer comprises Cu, Au, Ag, Cr, or an alloy thereof.

[11] A tunnel magnetoresistive element described in [9], wherein the thickness of the interlayer is controlled.

[12] A tunnel magnetoresistive element described in [9], wherein bias voltage applied to the interlayer is controlled.

[13] A tunnel magnetoresistive element described in [9], wherein the crystal orientation of a nonmagnetic single-crystal metal layer is set in the direction of (100)±10°, (111)±10°, (110)±10°, or (112)±10° of a cubic system, thereby increasing electron conductivity and evenness.

[14] A tunnel magnetoresistive element described in [9], disposed so as to be connected to intersections of word lines and bit lines of a matrix-type magnetic random access memory.

[15] A tunnel magnetoresistive element including a double underlayer including an amorphous MgO layer and a (001)-highly-oriented MgO layer.

[16] A tunnel magnetoresistive element described in [15], wherein the thickness of the amorphous MgO layer is set in the range of 3 to 10 nm and the thickness of the (001)-highly-oriented MgO layer is set in the range of 3 to 10 nm, and thereby surface roughness is reduced.

[17] A tunnel magnetoresistive element described in [15], wherein, by providing the underlayer, roughness of a ferromagnetic layer is reduced and magnetostatic coupling between ferromagnetic layers is reduced.

[18] A tunnel magnetoresistive element described in [15], wherein, by using the underlayer, roughness of an ultrathin ferromagnetic electrode layer with a thickness of 15 atomic layers or less is reduced and the magnetoresistive effect is increased.

[19] A tunnel magnetoresistive element described in [15], wherein a flat nonmagnetic layer with a thickness of 20 atomic layers or less is disposed between a barrier layer and a ferromagnetic electrode layer, with the underlayer lying, and, thus the bias dependence of magnetoresistive effect is controlled.

[20] A tunnel magnetoresistive element described in [15], wherein, by using the underlayer so that a ferromagnetic electrode layer is oriented in the (001) direction of a body-centered cubic lattice, a face-centered cubic lattice, or a tetragonal lattice and using the (001)-highly-oriented MgO layer as a barrier layer, a large magnetoresistive effect is produced.

[21] A tunnel magnetoresistive element described in [15], wherein a (001)-oriented layer formed by combining Au, Ag, Cu, Al, Pt, Ir, Pd, Mo, W, Ta, Cr, Ru, Rh, Mn, Fe, Co, and Ni is disposed between the underlayer and the magnetoresistive element, and thereby evenness is improved and electrode resistance is reduced.

BEST MODE FOR CARRYING OUT THE INVENTION

The embodiments of the present invention will now be illustrated with reference to the drawings.

[A] A first group of the present invention will be described.

Figure 3:
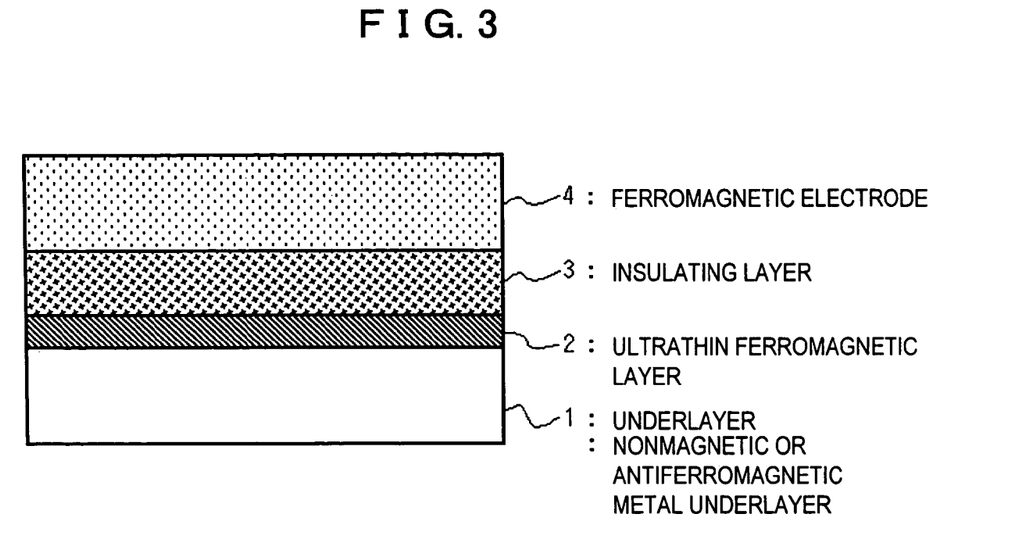
FIG. 3 is a sectional view of a ferromagnetic tunnel magnetoresistive element according to a first embodiment of a first group of the present invention.

FIG. 3 is a sectional view of a ferromagnetic tunnel magnetoresistive element according to a first embodiment of the first group of the present invention.

In this figure, reference numeral 1 designates an underlayer formed of, for example, a nonmagnetic metal film or an antiferromagnetic metal film, and reference numeral 2 designates an ultrathin ferromagnetic layer. The thickness of the ultrathin ferromagnetic layer is set in the range of 1 to 15 atomic layers. Reference numeral 3 designates an insulating layer, and reference numeral 4, a ferromagnetic electrode.

By providing the ultrathin ferromagnetic layer (thickness: 1 to 15 atomic layers) 2 between the underlayer 1 and the insulating layer 3, the spin polarization of the ferromagnetic layer is increased and, resultingly, a large magnetoresistive effect is produced. The spin magnetic moment of Fe atoms isolated in a vacuum is about 4 $\mu_B$ ($\mu_B$: Bohr magneton) per atom. However, if the Fe atoms enter a crystal to form a body-centered cubic lattice, the spin magnetic moment per atom is reduced to about 2.2 $\mu_B$. This is because each electron orbit has a range of energy due to communication of adjacent Fe atoms in a solid.

It is generally known that magnetic moment is increased by extremely reducing Fe layer thickness to confine electrons in the Fe layer and thus to reduce movement.

Focusing attention on this point, in the present invention, the ultrathin ferromagnetic layer 2 is used as an electrode to produce a larger magnetoresistive effect. In order to get the most out of this effect, it is preferable that the thickness of the ultrathin ferromagnetic layer 2 be set at one atomic layer.

Unfortunately, if the thickness is one atomic layer in practice, the Curie point decreases or the magnetization process changes. Accordingly, by setting the thickness of the ultrathin ferromagnetic layer 2 in the range of 1 to 15 atomic layers, the best result is produced. Preferably, this ferromagnetic layer is deposited on an underlayer, such as that of Au, Ag, Cu, Cr, V, Nb, Mo, Ta, W, Al, Pt, Ir, Rh, Ru, Pd, Os, or Mn, namely, on the nonmagnetic or antiferromagnetic metal layer 1 so that electrons (d electrons) of Fe atoms do not communicate with one another between the ferromagnetic layer and the underlayer.

Preferably, the underlayer is of single crystal from the viewpoint of forming the ultrathin ferromagnetic layer with a good reproducibility.

Preferably, the crystal of the underlayer has cubic symmetry and is orientation in (100), (111), (110) or (112) in order to obtain an even single-crystal surface.

Figure 4:
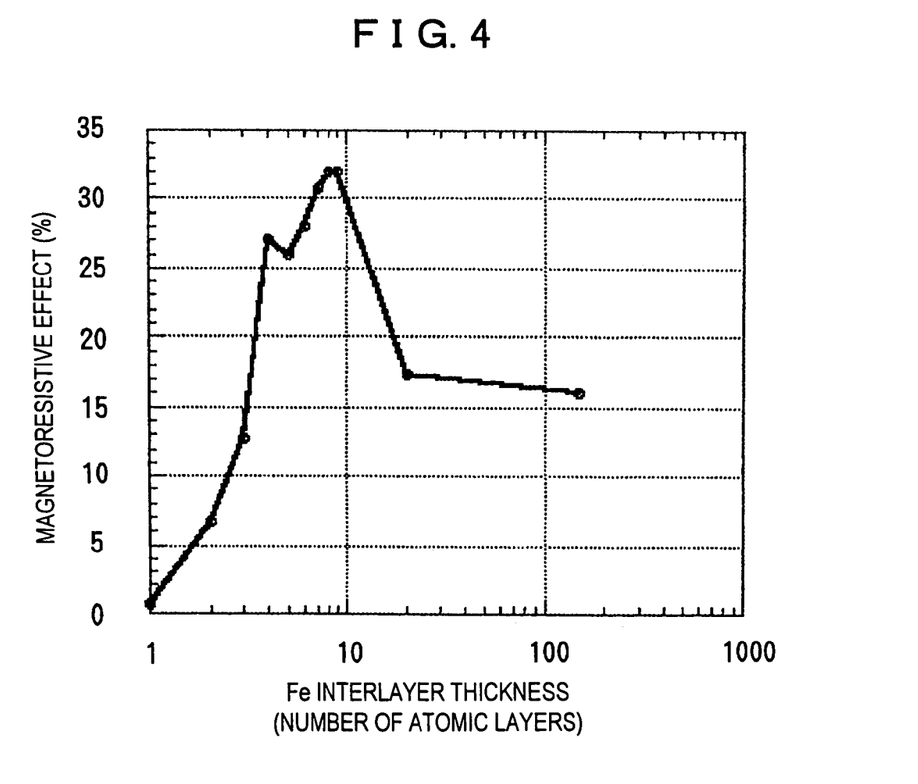
FIG. 4 is a plot showing a characteristic of the ferromagnetic tunnel magnetoresistive element according to the first embodiment of the first group of the present invention.

A very thin Fe layer is deposited on a single-crystal Cr surface, and an alumina insulating layer and a CoFe upper electrode are deposited on the Fe layer to form a ferromagnetic tunnel junction. The dependence of the magnetoresistive effect of the tunnel junction on Fe layer thickness is shown in FIG. 4.

The magnetoresistive effect is substantially two times increased by setting the thickness of the Fe layer in the range of 4 to 10 atomic layers.

Figure 5:
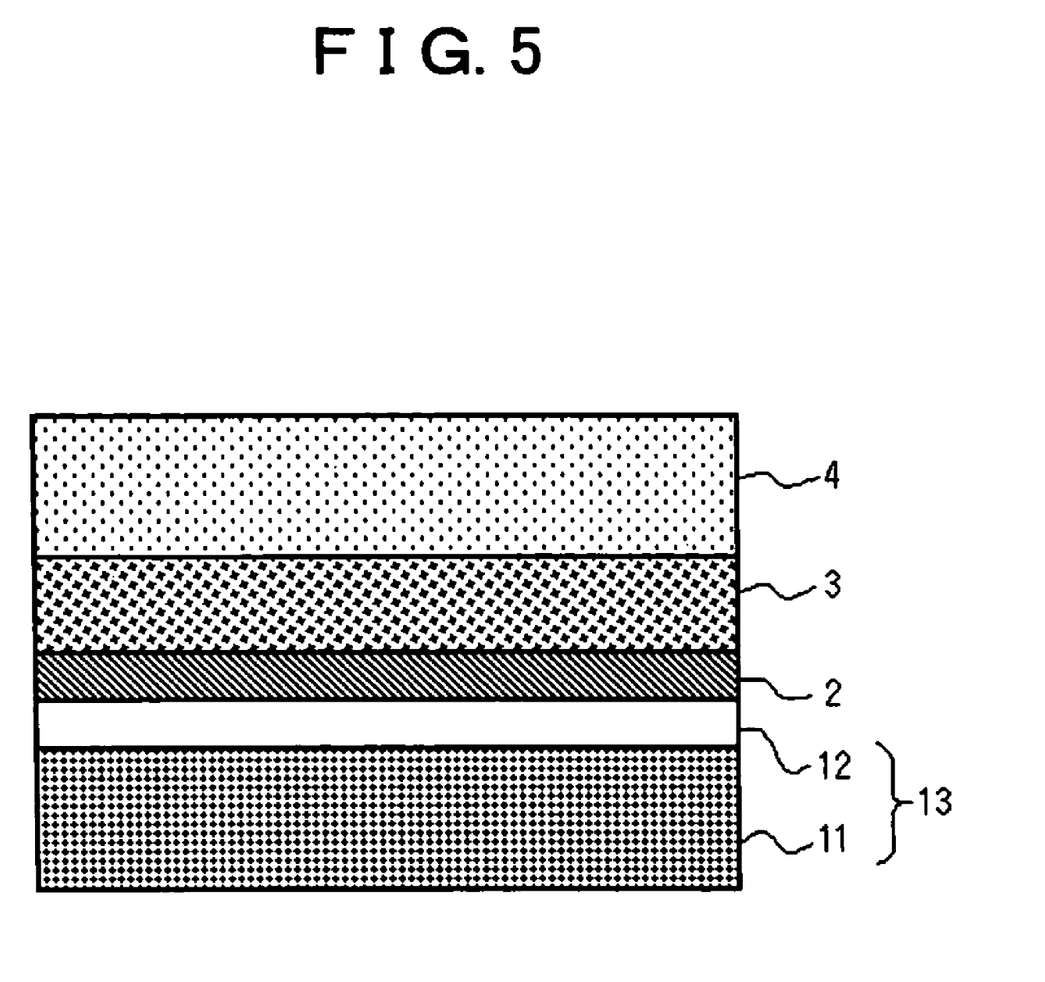
FIG. 5 is a sectional view of a ferromagnetic tunnel magnetoresistive element according to a second embodiment of the first group of the present invention.

FIG. 5 is a sectional view of a ferromagnetic tunnel magnetoresistive element according to a second embodiment of the first group of the present invention.

In the second embodiment, the nonmagnetic or antiferromagnetic metal layer 1 in the first embodiment is replaced with an artificial antiferromagnetic coupling layer 13 including a nonmagnetic or antiferromagnetic interlayer 12 (the composition contains Au, Ag, Cu, Cr, Pt, Pd, Ir, Ru, Rh or an alloy of these metals) formed on a ferromagnetic exchange-coupling layer 11 (the composition contains ferromagnetic metals, such as Fe, Co, Ni, or an alloy of these metals, and other metals, such as Pt, Pd, Ir, and Ru; the thickness is 0.7 to 1.5 times that of the ultrathin ferromagnetic layer 2). Thus, the magnetization of the ultrathin ferromagnetic layer 2 is fixed by the antiferromagnetic exchange coupling with the ferromagnetic exchange-coupling layer 11.

This structure allows the magnetization of the ultrathin ferromagnetic layer 2 to be fixed without affecting its electron state.

In this instance, the thickness of the nonmagnetic or antiferromagnetic interlayer 12 is set so that antiferromagnetic exchange coupling occurs between the ultrathin ferromagnetic layer 2 and the ferromagnetic exchange-coupling layer 11 (for example, if the interlayer is formed of an fcc-Ir (100) film, the thickness is set in the range of 3 to 6 atomic layers).

[B] A second group of the present invention will be described.

Figure 6:
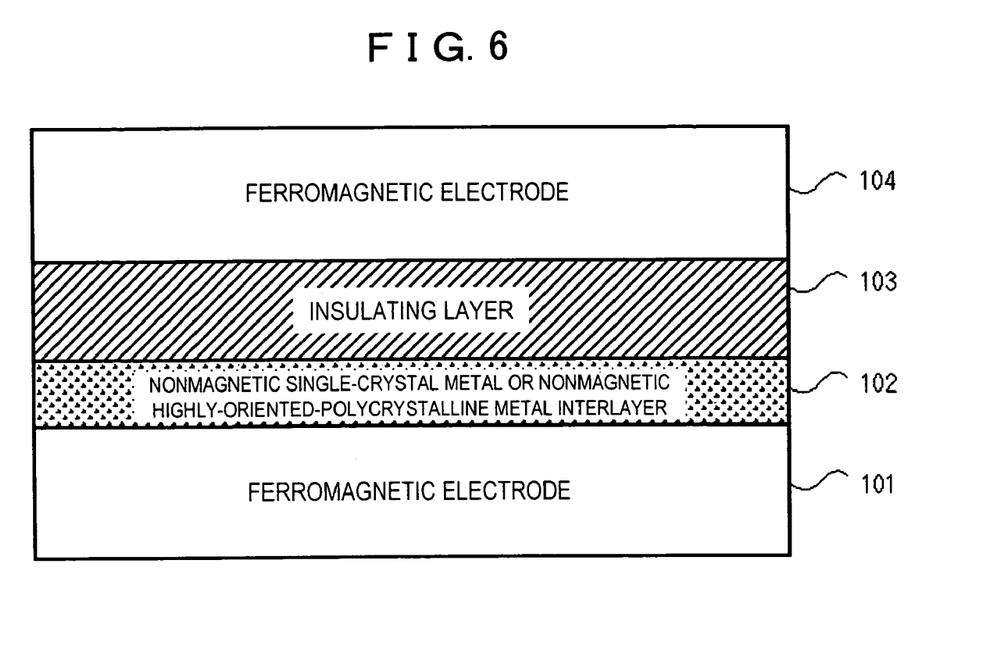
FIG. 6 is a sectional view of a tunnel magnetoresistive element according to a second group of the present invention.

FIG. 6 is a sectional view of a tunnel magnetoresistive element according to the second group of the present invention.

As shown in this figure, a nonmagnetic single-crystal metal or nonmagnetic highly-oriented-polycrystalline metal interlayer 102, an insulating layer 103, and a ferromagnetic electrode 104 are formed on a ferromagnetic electrode 101, in that order. Thus, the nonmagnetic single-crystal metal or nonmagnetic highly-oriented-polycrystalline metal interlayer 102 serves as a nonmagnetic layer of the tunnel magnetoresistive element having the nonmagnetic interlayer.

The interlayer 102 can provide still larger magnetoresistive effect if it is formed of Cu, Au, Ag, Cr, or an alloy based on these metals with a suitable thickness.

In addition, by controlling bias voltage applied to the interlayer 102, the polarity of the magnetoresistive effect can be reversed.

Also, by setting the crystal orientation of the nonmagnetic interlayer in the direction of (100)±10°, (111)±10°, (110) ±10°, or (112)±10° of a cubic system, still far larger magnetoresistive effect can be obtained.

Figure 7:
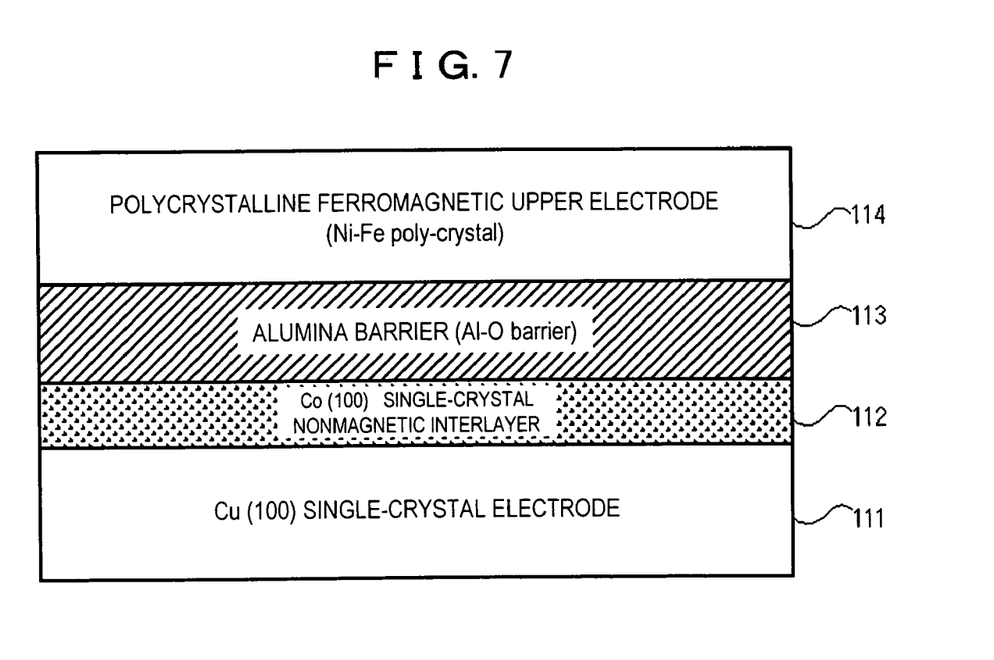
FIG. 7 is a sectional view of a tunnel magnetoresistive element according to the second group of the present invention.

FIG. 7 is a sectional view of a tunnel magnetoresistive element according to a first embodiment of the second group of the present invention.

Figure 8:
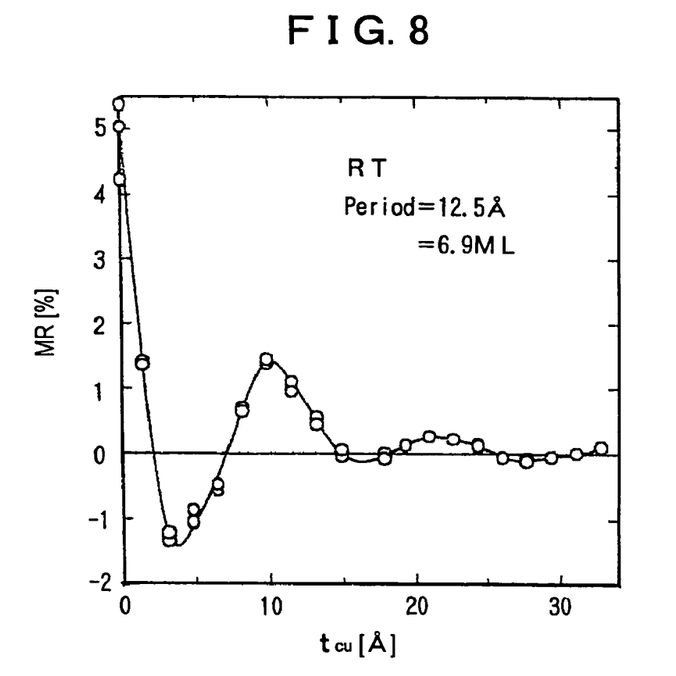
FIG. 8 is a plot showing the dependence of the magnetoresistance of a tunnel magnetoresistive element according to the second group of the present invention on Cu layer thickness at a low bias and room temperature.

In this element, for example, Pt, Co, and Cu buffer layers are deposited on a MgO(100) single-crystal or highly-oriented-polycrystalline substrate, in that order, followed by planarizaition. Then, as shown in FIG. 7, a Co(100) single-crystal electrode 111 and a Cu(100) single-crystal nonmagnetic interlayer 112 are deposited, and further an alumina barrier (Al—O barrier) 113 and a polycrystalline ferromagnetic upper electrode (Ni—Fe polycrystal) 114 are deposited. The magnetoresistive effect of this element at low bias varies like oscillation depending on the thickness of the Cu layer 112, as shown in FIG. 8. This obviously shows that the presence of the Cu layer 112 affects spin polarization.

The thickness allowing the magnetoresistive effect to be reduced to one tenth is about 2 nm, and it is about five times increased in comparison with known data, such as the results of Moodera et al. shown in FIG. 1.

Figure 9:
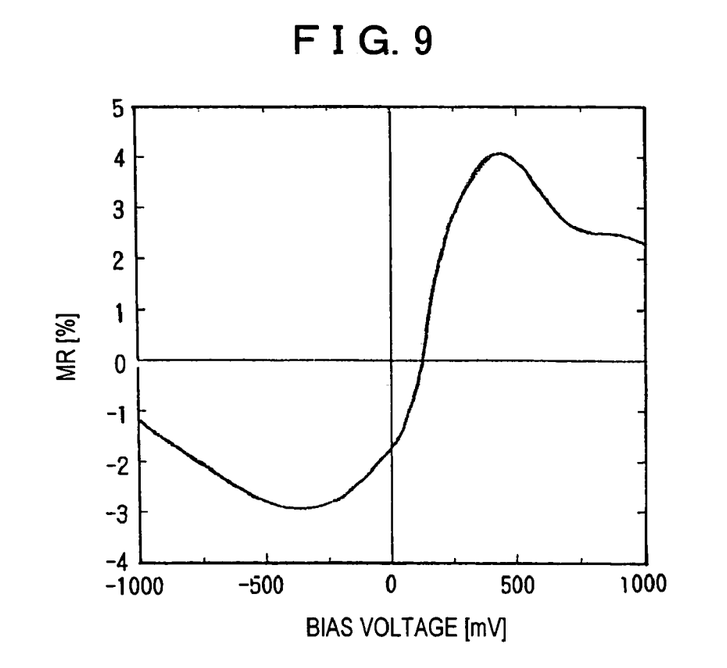
FIG. 9 is a plot showing the bias dependence at room temperature of the magnetoresistance of a tunnel magnetoresistive element according to the second group of the present invention.

The bias dependence of the magnetoresistance can also be changed to various forms. In particular, by suitably setting thickness, an element whose magnetoresistance sign is reversed depending on the polarity of bias, as shown in FIG. 9, can be provided. In this instance, the magnitude of the magnetoresistance about ten times increases in comparison with that in the case of polycrystal of Moodera et al, shown in FIG. 2.

The substrate may be formed of Si or GaAs(100) single crystal instead of the foregoing material. If the nonmagnetic single-crystal or highly-oriented-polycrystalline layer is formed of Au, Ag, or Cr(100), MgO(100) or GaAs(100) is used as the substrate.

By utilizing those characteristics, for example, a highly stable magnetic field sensor can be provided. The resistance of a magnetoresistive element varies with temperature. In measurement for the magnetoresistive effect, therefore, differential detection is generally performed using two magnetoresistive elements with the same characteristics. In the differential detection, while a measurement magnetic field is applied to only one of the elements, changes in resistance of the element is detected by comparison with those of the other element. Unfortunately, this method makes an apparatus circuit complicated and variation among elements causes errors in measurement.

On the other hand, if an alternating voltage is applied to an element having the characteristics shown in FIG. 9, higher harmonics occur due to nonlinear response resulting from magnetoresistance. The strength, sign, and phase of the higher harmonics depend on the direction of magnetization and this nonlinear response depends on a ballistic conductive component. Accordingly, the higher harmonics are extremely stable to changes of external environment, regardless of changes in electrical resistance with temperature. Therefore, a magnetic field sensor using the magnetoresistive element of the present invention makes it possible to sense the direction of a magnetic field with ultra-high stability and ultra-high sensitivity, without differential detection.

In the second group of the present invention, a quantum size effect, particularly the relationship between spin polarization quantum well level and tunnel magnetoresistive effect, was examined, using an artificial single crystal lattice formed of a ferromagnetic metal and a nonmagnetic metal as the lower electrode, as described above. An MTJ (magnetic tunnel junction) is formed which includes an fcc Co(100) single-crystal electrode and an amorphous Al—O tunnel barrier layer with a nonmagnetic Cu(100) layer (0 to 32 Å) therebetween (see FIG. 7). The dependence of the tunnel magnetoresistive effect on Cu thickness was measured, and the results are shown in FIG. 8. This plot shows that the MR (magnetoresistance) ratio exhibits damped oscillation with a period of 12.5-Å Cu thickness. Worthy of special note is that a larger oscillation was observed as the sign of MR ratio was greatly reversed. This oscillation period agrees with the period of the coupling between layers of the Co(100)/Cu (100) multilayer film, probably depending on the spin polarization quantum well level.

Figure 10:
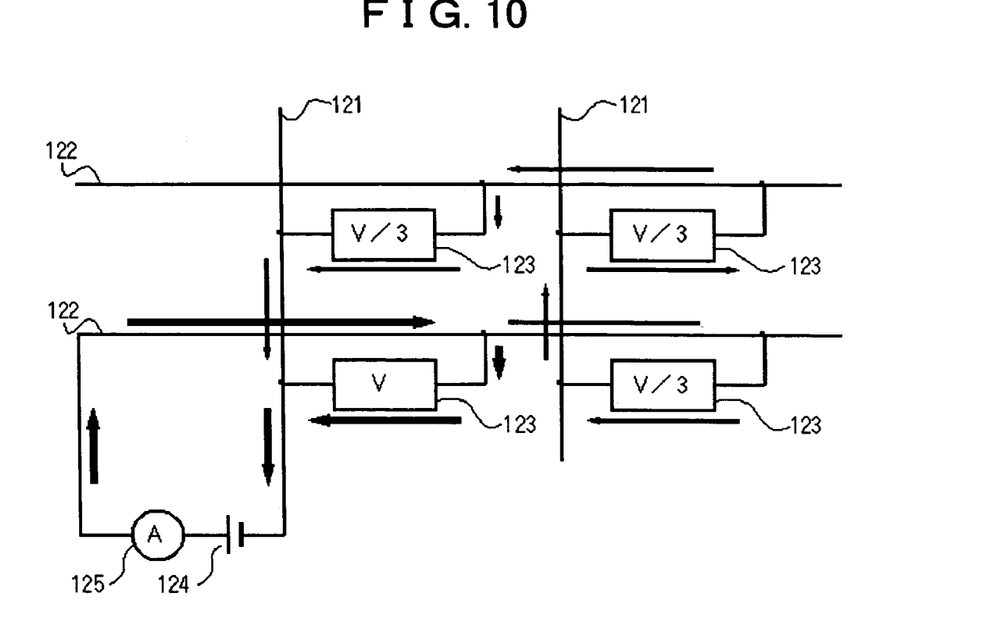
FIG. 10 is a first circuit configuration using a tunnel magnetoresistive element of the second group of the present invention.

FIG. 10 is a first circuit configuration using the tunnel magnetoresistive element of the second group of the present invention.

In this figure, reference numeral 121 designates a word line; 122, a bit line; 123, a tunnel magnetoresistive element of the present invention; 124, a direct-current power supply; and 125, an ammeter.

By using the tunnel magnetoresistive element of the present invention, a very simple ferromagnetic random access memory can be achieved. In known ferromagnetic random access memories, a MOS-FET has to be used as a pass transistor to access a tunnel magnetoresistive element, which is involved in recording.

If a direct voltage V is applied to a pair of word-bit lines, the voltage is placed on the tunnel element at their intersection, and, also, a voltage of, for example, V/3 is placed on surrounding elements. Thus, conventional elements produce a problem of cross talk with surrounding elements.

On the other hand, the tunnel magnetoresistive element of the present invention, having the characteristics shown in FIG. 9 exhibits a magnetoresistive effect for a bias voltage V, but not for V/3. Consequently, the magnetic state of an element at an intersection can be selectively read from a simple matrix as shown in FIG. 10, without cross talk with other elements.

Figure 11:
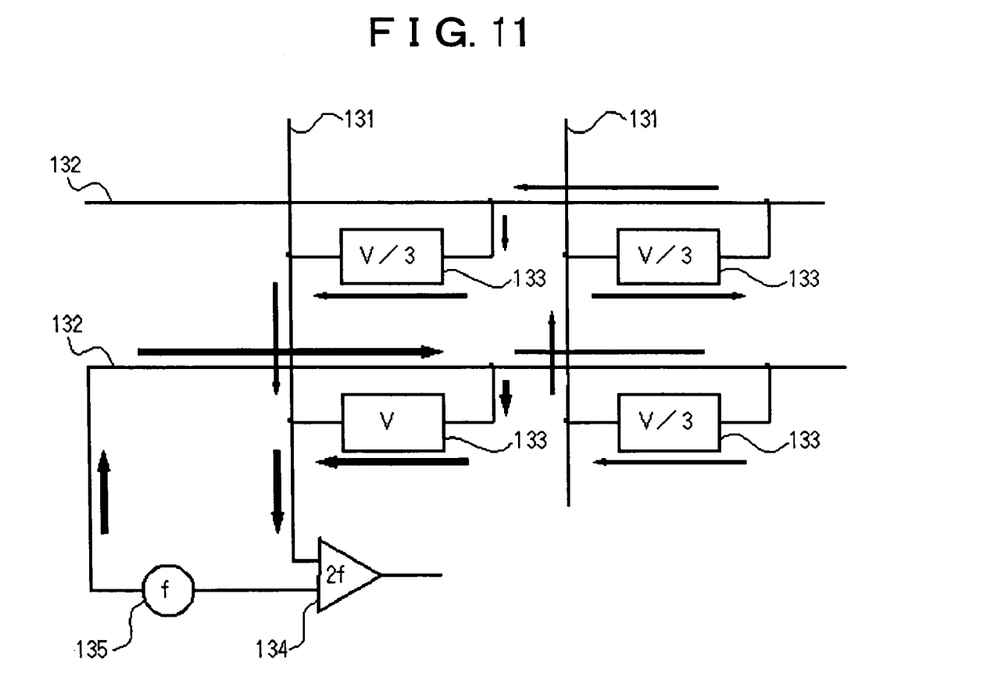
FIG. 11 is a second circuit configuration using a tunnel magnetoresistive element in the second group of the present invention.

FIG. 11 shows a second circuit configuration using the tunnel magnetoresistive element in the second group of the present invention. In this figure, reference numeral 131 designates a word line; 132, a bit line; 133, a tunnel magnetoresistive element of the present invention; 134, a harmonic detector; and 135, a high-frequency power supply.

As shown in FIG. 11, another form may be applied in which a signal is selectively read with second harmonics. If magnetoresistance does not depend on bias, the signal contribution ratio of a targeted element to other elements is 1:1/3 in measurement of magnetoresistance with linear response. On the other hand, in detection using the generation of harmonics by nonlinear secondary response or changes in pulse form, the signal ratio becomes 1:1/9, and thus, cross talk from surrounding elements is extremely reduced. Furthermore, the ratio can be further increased by setting the bias dependence to be optimal.

The fcc Cu(100) single crystal is used as the interlayer in the foregoing embodiment. Alternatively, a single crystal or a highly oriented polycrystal of Au, Ag, Cr, or an alloy based on these metals may be used.

[C] A third group of the present invention will be described.

Figure 12:
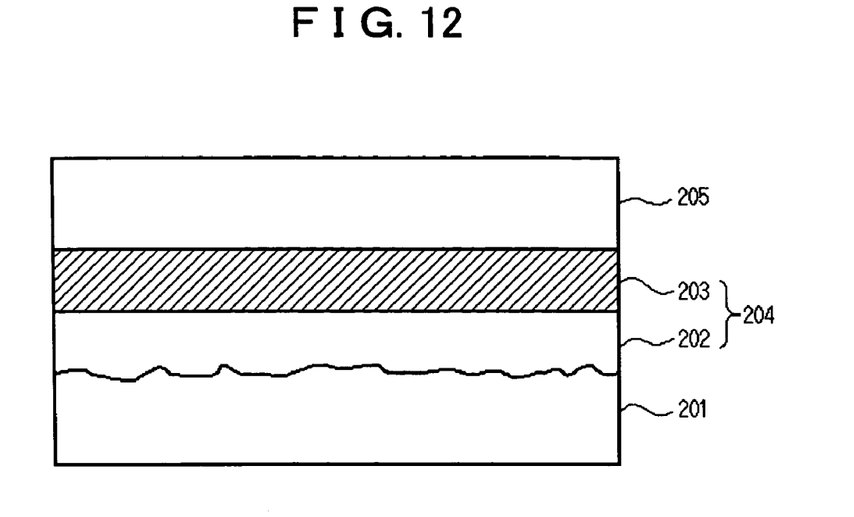
FIG. 12 is a schematic illustration of a flat tunnel magnetoresistive element according to a third group of the present invention.

FIG. 12 is a schematic illustration of a flat tunnel magnetoresistive element according to the third group of the present invention.

In this figure, reference numeral 201 designates a substrate (Si LSI, $SiO_2$, or the like); 204 designates a double underlayer composed of an amorphous MgO layer 202 and MgO(001) crystal layer 203; and 205 designates a magnetoresistive element having a highly oriented, even interface.

The flat tunnel magnetoresistive element is prepared through the following procedure:

(1) Clean the substrate (Si LSI, $SiO_2$, or the like) 201 with ultrapure water.

(2) Remove the water absorbed at the surface by argon reverse-sputtering cleaning in a sputtering chamber.

(3) Deposit MgO (10 nm) by sputtering.

Only through these steps, MgO grows amorphous to be the amorphous MgO layer 202 in the early stage and, then, to be the MgO(001)-oriented highly oriented crystal layer 203. Preferably, the thickness of the amorphous MgO layer 202 is 3 to 10 nm, and the thickness of the MgO(001) crystal layer 203 is also 3 to 10 nm.

By forming the highly oriented, flat, ferromagnetic tunnel magnetoresistive element including the underlayer 204 composed of the amorphous MgO layer 202 and the MgO(001) crystal layer 203, as described above, the flat tunnel magnetoresistive element exhibiting quantum size effect, which, for the structures of the first and second groups of the present invention, can be formed only on a single crystal substrate, can be provided on an amorphous substrate, such as that of $SiO_2$, and polycrystalline wires.

Figure 13:
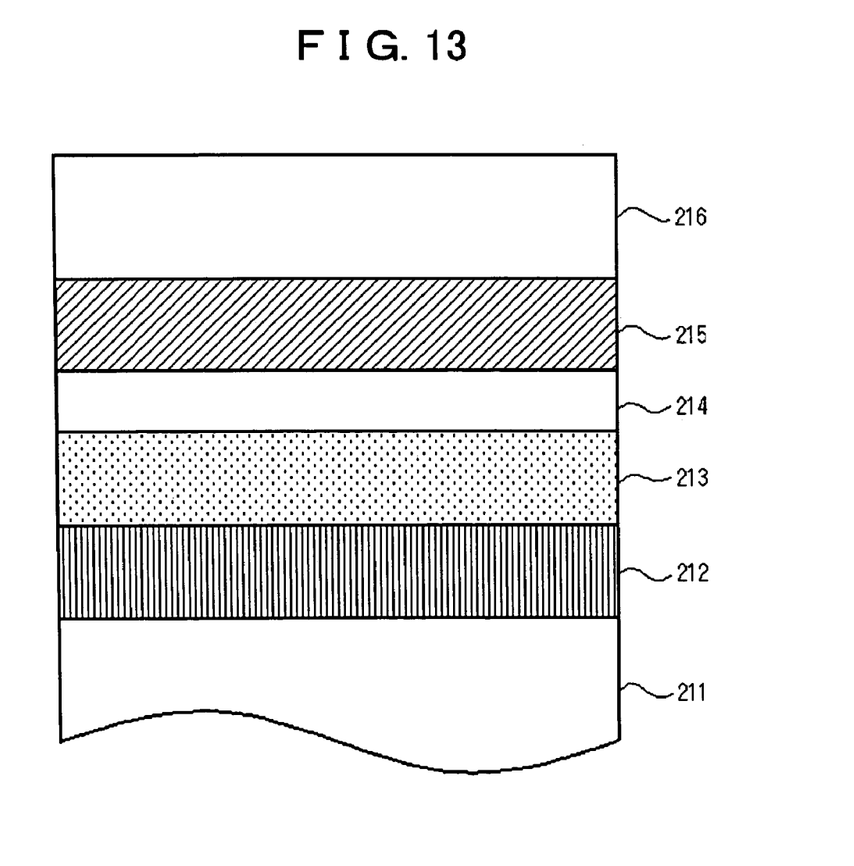
FIG. 13 is a sectional view of the flat tunnel magnetoresistive element according to the third group of the present invention.

FIG. 13 is a sectional view of a flat tunnel magnetoresistive element according to the third group of the present invention.

In the figure, reference numeral 211 designates a Si substrate with an oxide film; 212, a MgO layer (10 nm); 213, Fe(001) layer (20 nm); 214, an amorphous Al—O layer; 215, an upper electrode (polycrystalline Ni—Fe) layer; and 216, an Au cap layer.

A method for manufacturing the flat tunnel magnetoresistive element will be described below:

(1) Clean the Si wafer (substrate) 211 with the oxide film with ultrapure water.

(2) Remove the water absorbed at the surface by argon reverse-sputtering cleaning in a sputtering chamber.

(3) Deposit the MgO 212 (10 nm) by sputtering.

(4) Take out the object in the air and transfer it in an MBE chamber.

(5) Heat the object in UHV to remove the water absorbed at the surface.

(6) Deposit the Fe 213 (20 nm) by sputtering.

(7) Annealing the object to planarize the surface.

(8) After reducing substrate temperature to room temperature, deposit Al and naturally oxidize it to form the Al—O tunnel barrier layer (amorphous Al—O layer) 214.

(9) Form the upper electrode (polycrystalline Ni—Fe) layer 215 and the Au cap layer 216.

After being taken out in the air, the magnetoresistive element prepared through the above-described process was subjected to X-ray diffraction (FIG. 14) and cross-sectional transmission electron microscopy (FIGS. 15 and 16), and was then subjected to measurement of the magnetoresistive effect after being processed to a device.

Figure 14:
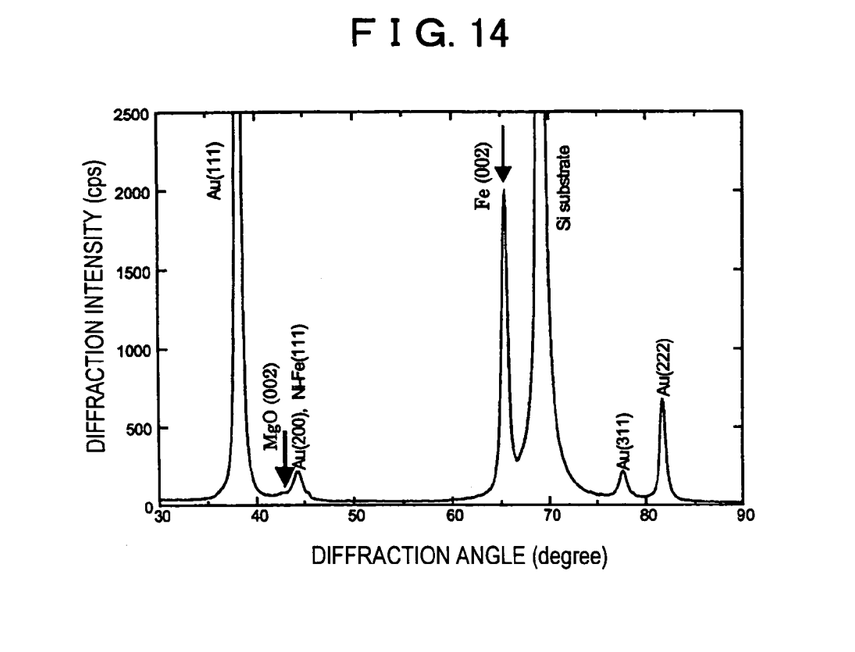
FIG. 14 is an X-ray diffraction spectrum of a high-quality tunnel magnetoresistive element according to the third group of the present invention, which is formed on the amorphous/(001)-highly-oriented MgO composite underlayer deposited on a Si substrate with an oxide film.

FIG. 14 is an X-ray diffraction spectrum of the high-quality tunnel magnetoresistive element according to the third group of the present invention, which is formed on the amorphous/(001)-highly-oriented MgO composite underlayer that has grown on the Si substrate with the oxide film. In the figure, the vertical axis represents X-ray diffraction intensity (cps). A sample in which a larger number of crystal planes are aligned parallel to the surface of the sample with higher crystallinity exhibits higher diffraction intensity. The horizontal axis represents diffraction angle (degree). Since diffraction angle corresponds the intervals between crystal planes, a different crystal plane form a peak at a different angle.

FIG. 14 shows that the MgO diffraction line forms only a (002) peak, hence exhibiting excellent (001) orientation. The Fe diffraction also exhibits only a (002) peak with a high intensity. This shows that high quality crystals have grown in the (001) direction.

The sample was subjected to X-ray diffraction while being rotated, with the diffraction angle set at that of the Fe(002) peak. As a result, it has been shown that the atomic planes of the Fe layer are aligned at angles of $\pm 1°$ from (001) planes. By using the MgO double underlayer of the present invention, the plane orientation of the ferromagnetic electrode layer can be aligned at angles of $\pm 1°$ from (001) planes. In addition, the surface roughness of the Fe layer was observed with an atomic force microscope. As a result, the roughness was 0.15 nm or less in terms of a RMS value (effective mean deviation). Thus, by using the MgO double underlayer, the surface roughness of the ferromagnetic electrode layer can be reduced, and specifically to 0.15 nm or less. In particular, by setting the amorphous MgO layer thickness in the range of 3 to 10 nm and the highly oriented MgO layer thickness in the range of 3 to 10 nm, those results were produced.

Figure 15:
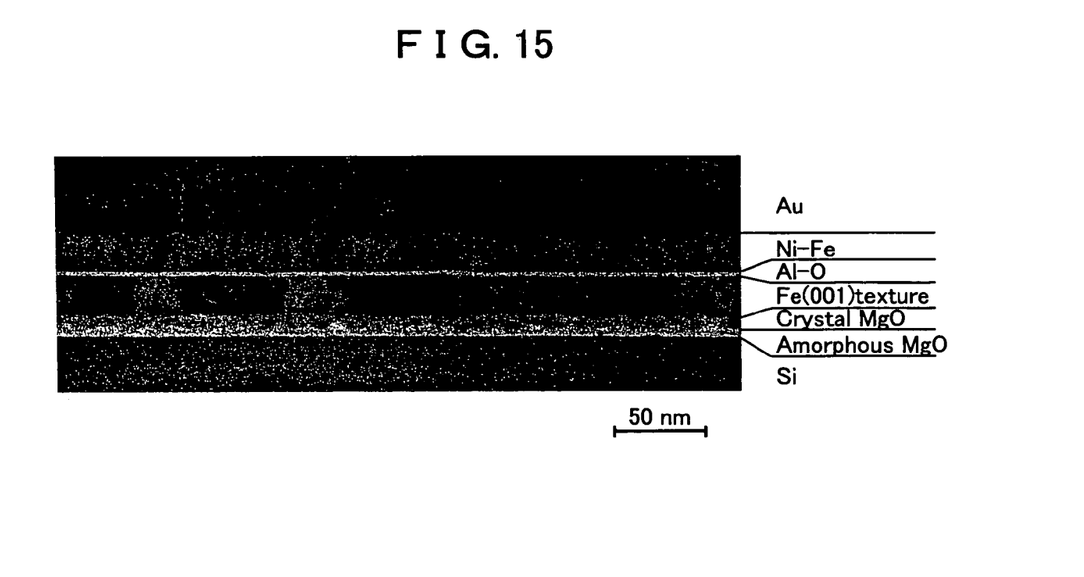
FIG. 15 is a cross-sectional transmission electron micrograph of a high-quality tunnel magnetoresistive element formed on an amorphous/(001)-highly-oriented MgO composite underlayer deposited on a Si substrate with an oxide film, according to the third group of the present invention.
Figure 16:
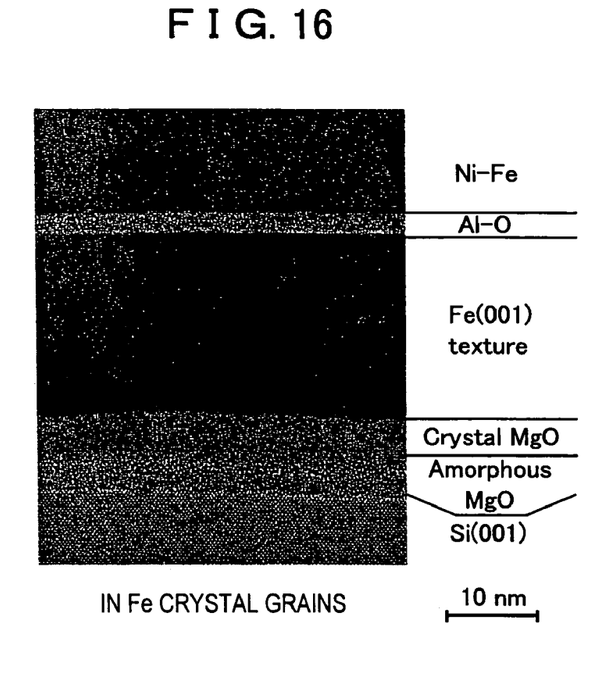
FIG. 16 is a high-resolution cross-sectional transmission electron micrograph of a high-quality tunnel magnetoresistive element formed on an amorphous/(001)-highly-oriented MgO composite underlayer deposited on a Si substrate with an oxide film, according to the third group of the present invention.

The cross-sectional transmission electron micrographs shown in FIGS. 15 and 16 show that the portion from the bottom to about four-tenths of the MgO layer 212 is an amorphous layer 212-1 and that the other portion from the top to about six-tenths is a (001)-oriented highly oriented layer 212-2. Also, it is shown that the Fe layer 213 with an extremely even surface has been formed on the MgO. The evenness of the layer reduced the shift of a hysteresis loop of magnetostatic coupling resulting from surface roughness to 2 Oe or less without using a special bias magnetic field. Thus, by forming a flat tunnel magnetoresistive element using the MgO double underlayer, magnetostatic coupling can be reduced.

In the structure in which on the MgO double underlayer of the present invention deposited are Cr (001) buffer layer to 20 nm, an FeCo alloy ferromagnetic layer serving as a lower ferromagnetic layer to a small thickness of the order of electron layers, amorphous alumina serving as a barrier, and a FeCo polycrystalline alloy serving as an upper electrode, in that order, the magnetoresistive effect increases as in the case using a single crystal underlayer. In particular, a lower ferromagnetic layer thickness of 15 atomic layers or less increased the magnetoresistive effect to at least two times that in the case of a large thickness. Heat treatment of a sample with a thickness of 6 atomic layers resulted in a magnetoresistive effect of more than 70% at room temperature.

Thus, by forming an even ferromagnetic electrode layer with a thickness of 15 atomic layers or less using the MgO double underlayer, a magnetoresistive effect larger than ever was produced.

Another tunnel magnetoresistive element was prepared which includes a Pt(001) buffer layer, an fcc-Co(001) buffer layer, and a Cu(001) buffer layer deposited, in that order, on the MgO double underlayer of the present invention and further includes a Co(001) lower ferromagnetic electrode, a nonmagnetic interlayer with a thickness of the order of atomic layers, an amorphous alumina barrier, and an FeCo upper ferromagnetic electrode on the buffer layers.

As a result, the bias dependence of the tunnel magnetoresistive effect was controlled by setting the thickness of the Cu(001) nonmagnetic interlayer at 20 atomic layers or less, as in the case of the single crystal underlayer. In particular, by setting the thickness of the Cu(001) nonmagnetic interlayer at about 3 atomic layers, the resulting magnetoresistive element did not exhibit a magnetoresistive effect at a bias voltage of 130 mV, but exhibited at a bias voltage of 400 mV a magnetoresistive effect 10 times as large as that at a bias voltage of 130 mV. Consequently, by disposing the magnetoresistive effect elements of the third group of the present invention at the intersections of ferromagnetic random access memory wires drawn in an x-y matrix, record stored in a recording cell can be read without cross talk with other recording cells, even if no pass transistor is provided.

Thus, by disposing the flat nonmagnetic interlayer with a thickness of 20 atomic layers or less between the ferromagnetic electrode layer and the barrier layer using the MgO double underlayer, the bias dependence of magnetoresistance was controlled.

Still another magnetoresistive element was prepared which includes a (001)-highly-oriented lower ferromagnetic electrode layer, a (001)-highly-oriented MgO barrier layer, and a (001)-highly-oriented upper ferromagnetic electrode layer on the MgO double underlayer of the present invention.

As a result, a larger tunnel magnetoresistive effect of more than 90% was produced by combining heat treatment. Thus, by preparing a tunnel magnetoresistive element including the (001)-highly-oriented MgO barrier layer overlying the MgO double underlayer, a still larger magnetoresistive effect was produced.

Figure 17:
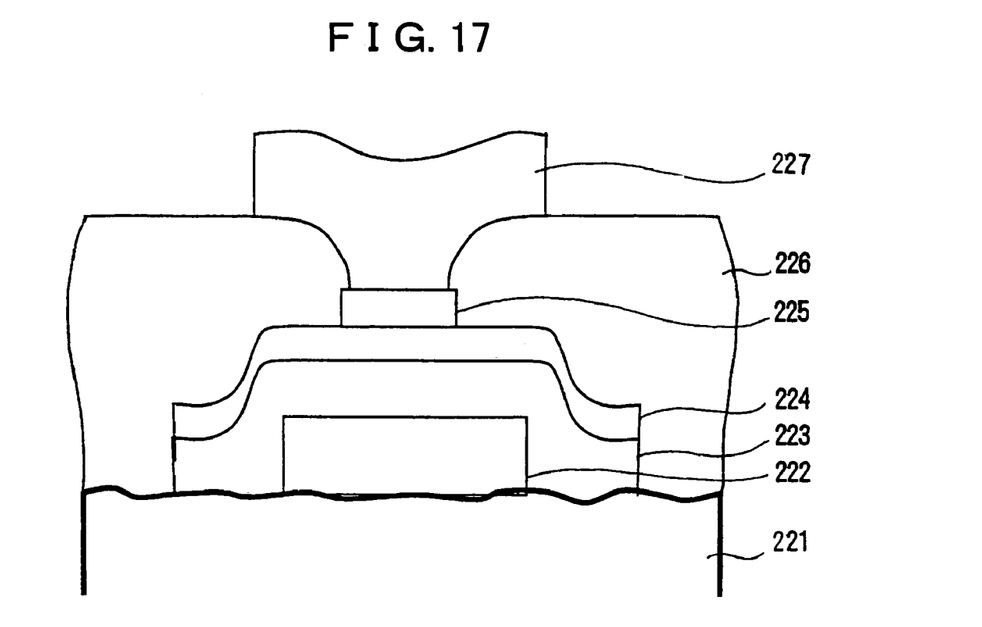
FIG. 17 is a sectional view of a high-quality tunnel magnetoresistive element having an amorphous (001)-highly-oriented MgO composite underlayer on a polycrystalline metal electrical wire with a rough surface, according to the third group of the present invention.

FIG. 17 is a sectional view of a high-quality tunnel magnetoresistive element having an amorphous (001)-highly-oriented MgO composite underlayer on a polycrystalline metal electrical wire with a rough surface, according to the third group of the present invention.

In the figure, reference numeral 221 designates a lower electrical wire; 222, a MgO double underlayer; 223, a lower ferromagnetic electrode; 224, a barrier layer; 225, an upper ferromagnetic electrode; 226, an electrical insulating layer; and 227, an upper electrical wire.

If high-quality tunnel magnetoresistive elements having the MgO underlayer of the present invention are provided on polycrystalline metal wires with electrical contact between the metal wires and lower ferromagnetic electrodes, electrical contact can be ensured by forming the lower ferromagnetic electrode 223 on the MgO underlayer 222 processed, as shown in FIG. 17.

The present invention is not limited to the above-described embodiments, and various modifications may be made according to the spirit of the invention, without departing from the scope of the invention. As described above, the present invention provides the following advantages:

[I] First (A) By precisely reducing the thickness of an electrode of a tunnel magnetoresistive element on the order of atomic layers, a large magnetoresistive effect can be produced. Specifically, by setting the thickness of the ferromagnetic metal electrode of the tunnel magnetoresistive element to be very small, the magnetization or substantial spin polarization of the ferromagnetic material is increased, and consequently a larger magnetoresistive effect can be produced.

(B) By forming a nonmagnetic metal underlayer of a single crystal, its thickness can be more easily controlled.

(C) By setting the crystal orientation of the nonmagnetic metal underlayer in the direction of $(100)\pm10°$, $(111)\pm10°$, $(110)\pm10°$, or $(112)\pm10°$ of a cubic system, evenness can be increased.

(D) By forming the underlayer of a nonmagnetic metal film or an antiferromagnetic metal film on a ferromagnetic exchange-coupling layer, the magnetization of the underlayer can be fixed without affecting the electron state of the ultrathin ferromagnetic layer.

[II] Second (A) By giving an element a structure preventing electron scattering of a nonmagnetic interlayer and precisely controlling the thickness of the nonmagnetic interlayer, the bias voltage dependence of the magnetoresistive effect can be artificially controlled.

(B) By disposing an ultrathin nonmagnetic layer having a thickness of the order of atomic layers between a ferromagnetic electrode and a barrier layer, the magnetoresistive effect of the resulting magnetoresistive element can be varied like oscillation depending on bias voltage.

(C) By forming the interlayer of Cu, Au, Ag, Cr, or an alloy based on these metals to an optimal thickness, the magnetoresistive effect can be set high.

(D) In addition, by controlling bias voltage applied to the interlayer, the polarity of the magnetoresistive effect can be reversed.

(E) By setting the crystal orientation of the nonmagnetic interlayer in the direction of $(100)\pm10°$, $(111)\pm10°$, $(110)\pm10°$, or $(112)\pm10°$ of a cubic system, still larger magnetoresistive effect can be produced.

(F) The magnetic state of an element at an intersection in a matrix-type magnetic random access memory can be read without cross talk with other elements.

(G) Furthermore, a signal can be selectively read with second harmonics of the matrix-type magnetic random access memory without cross talk with other elements.

[III] Third (A) By forming the double underlayer composed of the amorphous MgO layer and the (001)-highly-oriented MgO layer, a flat tunnel magnetoresistive element can be obtained.

(B) By setting the thicknesses of the amorphous MgO layer and (001)-highly-oriented MgO layer of the MgO underlayer in the range of 3 to 10 nm, surface roughness can be particularly reduced.

(C) By providing a magnetoresistive element on the underlayer, the roughness of a ferromagnetic layer can be reduced and, thus, magnetostatic coupling between the ferromagnetic layers can be reduced.

(D) By providing on the underlayer a tunnel magnetoresistive effect element including an ultrathin ferromagnetic electrode layer of 15 atomic layers or less in thickness to reduce the roughness of the electrode and to enhance the orientation, the magnetoresistive effect can be increased.

(E) By providing on the underlayer a tunnel magnetoresistive element including a barrier layer and a ferromagnetic electrode layer with a flat nonmagnetic layer of 20 atomic layers or less in thickness therebetween, the bias dependence of the magnetoresistive effect can be controlled.

(F) By forming on the underlayer a ferromagnetic electrode layer oriented in the (001) direction of a body-centered cubic lattice, a face-centered cubic lattice, or a tetragonal lattice and, further, by using a (001)-highly-oriented MgO layer as the barrier layer, a still larger magnetoresistive effect can be produced.

(G) By disposing a (001)-oriented layer formed by combining Au, Ag, Cu, Al, Pt, Ir, Pd, Mo, W, Ta, Cr, Ru, Rh, Mn, Fe, Co, and Ni between the MgO underlayer and the Magnetoresistive element, evenness can be improved and the electrode resistance can be reduced.

(H) By forming a highly-oriented, flat ferromagnetic tunnel magnetoresistive element having the amorphous MgO/(001)-highly-oriented MgO composite underlayer, the magnetoresistive element can be disposed on an amorphous substrate, such as $SiO_2$, and a Polycrystalline wire, and the resulting element can exhibit high-performance characteristics, such as quantum size effect, which have been exhibited only in the case of an element formed on a single-crystal substrate.

INDUSTRIAL APPLICABILITY

The tunnel magnetoresistive element of the present invention is suitably used in a magnetic sensor of a pickup head of a hard disk drive or a ferromagnetic random access memory.

The invention claimed is:

1. A tunnel magnetoresistive element comprising a nonmagnetic single-crystal metal interlayer provided between a barrier layer and a ferromagnetic electrode, wherein the crystal orientation of the nonmagnetic single-crystal metal interlayer is set in the direction of (100) ±10°, (111) ±10°, (110) ±10°, or (112) ±10° of a cubic system, thereby increasing electron conductivity and evenness.

2. A tunnel magnetoresistive element according to claim 1, wherein the interlayer comprises Cu, Au, Ag, Cr, or an alloy thereof.

3. A tunnel magnetoresistive element according to claim 1, wherein the thickness of the interlayer is 2 to 32 Å.

4. A tunnel magnetoresistive element according to claim 1, disposed so as to be connected to intersections of word lines and bit lines of a matrix-type magnetic random access memory.

5. A tunnel magnetoresistive element according to claim 1, wherein an underlayer or a substrate of the ferromagnetic electrode is formed of MgO (100) single-crystal.

6. A tunnel magnetoresistive element according to claim 1, wherein an underlayer or a substrate of the ferromagnetic electrode is formed of GaAs (100) single-crystal.

* * * * *